(12) United States Patent
Min et al.

(10) Patent No.: US 7,345,911 B2
(45) Date of Patent: Mar. 18, 2008

(54) MULTI-STATE THERMALLY ASSISTED STORAGE

(75) Inventors: Tai Min, San Jose, CA (US); Po-Kang Wang, San Jose, CA (US)

(73) Assignee: MagIC Technologies, Inc., Milpitas, CA (US)

( * ) Notice: Subject to any disclaimer, the term of this patent is extended or adjusted under 35 U.S.C. 154(b) by 0 days.

(21) Appl. No.: 11/353,326

(22) Filed: Feb. 14, 2006

(65) Prior Publication Data

US 2007/0189064 A1    Aug. 16, 2007

(51) Int. Cl.
    *G11C 11/00*   (2006.01)
(52) U.S. Cl. .................. 365/158; 365/171; 365/173
(58) Field of Classification Search ........... 365/158, 365/171, 173; 257/295; 438/3
    See application file for complete search history.

(56) References Cited

U.S. PATENT DOCUMENTS

| | | | |
|---|---|---|---|
| 6,166,948 A | 12/2000 | Parkin et al. | |
| 6,174,737 B1 | 1/2001 | Durlam et al. | |
| 6,783,999 B1 | 8/2004 | Lee | |
| 6,784,091 B1 | 8/2004 | Nuetzel et al. | |
| 6,806,096 B1 | 10/2004 | Kim et al. | |
| 6,815,248 B2 | 11/2004 | Leuschner et al. | |
| 6,858,441 B2 | 2/2005 | Nuetzel et al. | |
| 6,862,212 B2 | 3/2005 | Nickel et al. | |
| 6,881,351 B2 | 4/2005 | Grynkewich et al. | |
| 6,906,939 B2 | 6/2005 | Rinerson et al. | |
| 6,906,947 B2 | 6/2005 | Bloomquist et al. | |
| 7,072,208 B2 * | 7/2006 | Min et al. ................. | 365/171 |
| 2007/0054450 A1 * | 3/2007 | Hong et al. ................ | 438/257 |
| 2007/0121249 A1 * | 5/2007 | Parker ...................... | 360/126 |

OTHER PUBLICATIONS

HMG-05-024, U.S. Appl. No. 11/331,998, filed Jan. 13, 2006, "MRAM with Split Read-Write Cell Structures", assigned to the same assignee.
HMG-05-031, U.S. Appl. No. 11/264,587, filed Nov. 1, 2005, "Thermally Assisted Integrated MRAM Design and Process for Its Manufacture", assigned to the same assignee.
Thermally Assisted Switching in Exchange -Biased Storage Layer Magnetic Tunnel Junctions, by I.L. Prejbeanu et al., IEEE Trans. on Magnetics, vol. 40, No. 4, Jul. 2004, pp. 2625-2627.

\* cited by examiner

*Primary Examiner*—Gene N Auduong
(74) *Attorney, Agent, or Firm*—Saile Ackerman LLC; Stephen B. Ackerman

(57) ABSTRACT

A random access memory cell is described which is capable of storing multiple information states in a single physical bit. The basic structure combines a conventional MTJ with a reference stack that is magnetostatically coupled to the MTJ. The MTJ is read in the usual way but data is written and stored in the reference stack. Through use of two bit lines, the direction of magnetization of the free layer can be changed in small increments each unique direction representing a different information state.

17 Claims, 14 Drawing Sheets

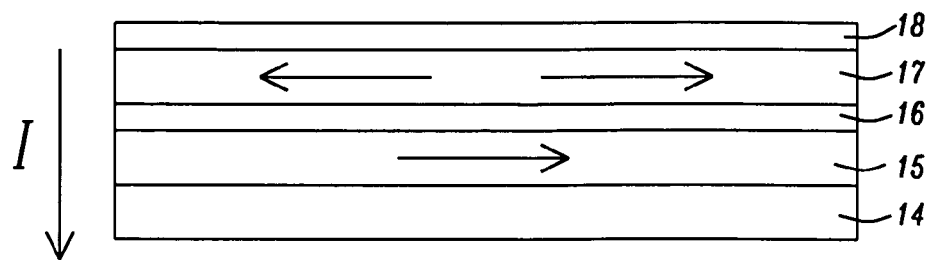
FIG. 1 — Prior Art
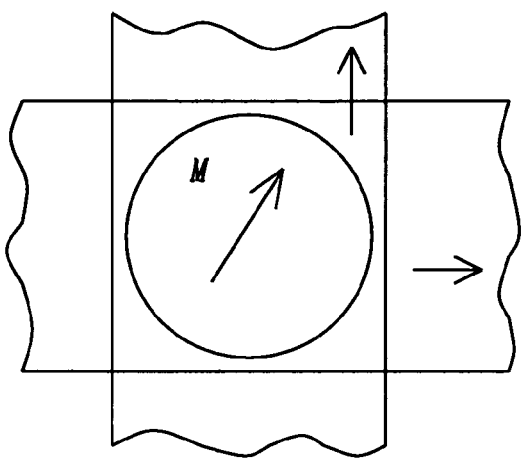
FIG. 2a
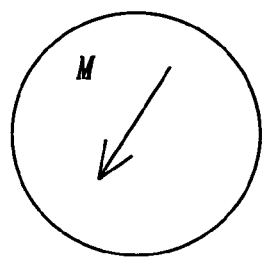    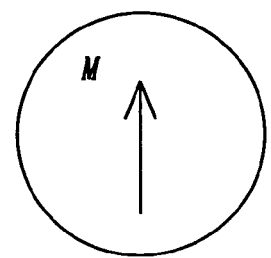
FIG. 2b            FIG. 2c

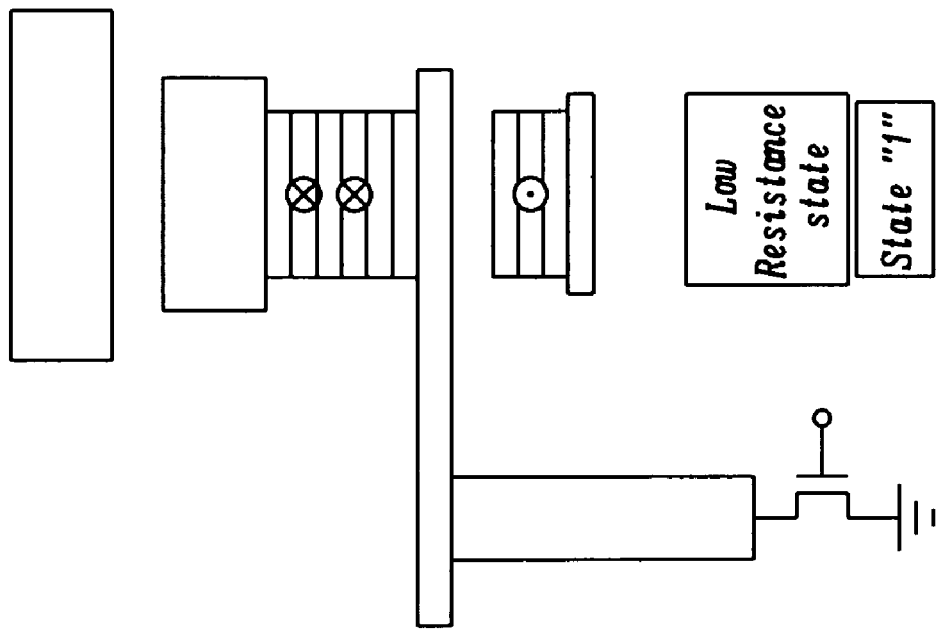
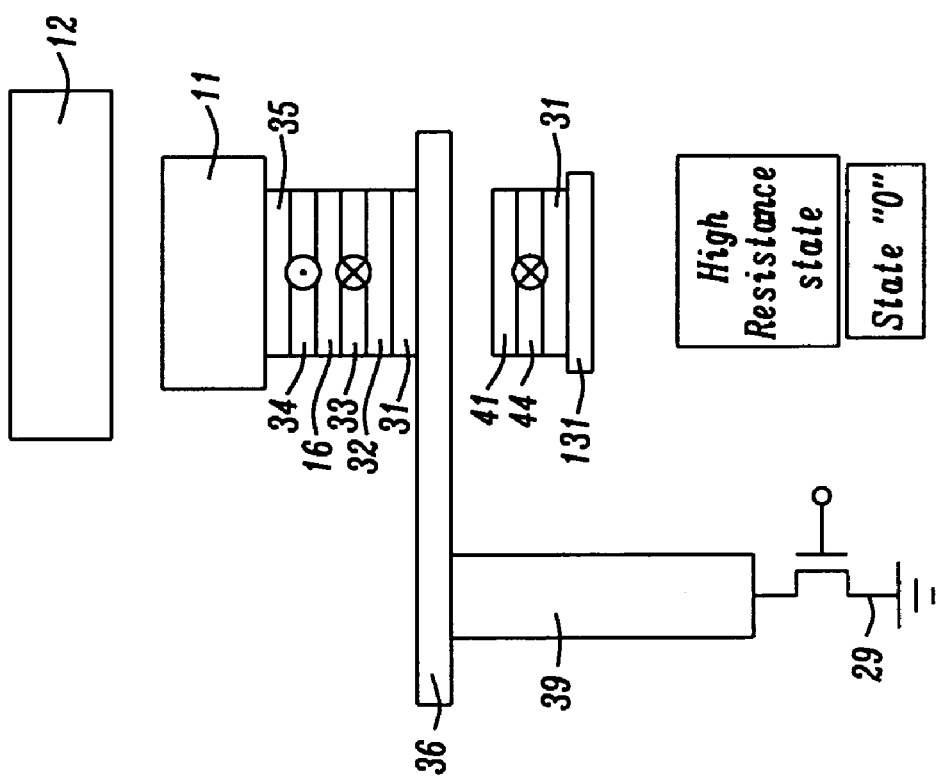
FIG. 14

MULTI-STATE THERMALLY ASSISTED STORAGE

RELATED APPLICATIONS (Ser. No. 11/331,998 filed on Jan. 13, 2006) discloses a split read-write cell structure without thermally assisted writing. (Ser. No. 11/264,587 filed on Nov. 1, 2005) discloses a single bit split cell structure with thermally assisted writing. Both are herein incorporated, by reference, in their entirety.

FIELD OF THE INVENTION

The invention relates to the general field of magnetic storage with particular reference to very dense arrays of magnetic tunnel junctions.

BACKGROUND OF THE INVENTION

Magnetic tunneling junctions (MTJ) with two ferromagnetic layers separated by a tunneling oxide layer have been widely studied for use as a random-access memory element. Usually one of the ferromagnetic layers is in a fixed direction (the pinned layer), while the other layer is free to switch its magnetization direction, and is usually called the free layer.

For magnetic random access memory (MRAM) applications, the MTJ is usually formed so that it exhibits an anisotropy, such as shape anisotropy. In its quiescent state, the free layer magnetization lies along the orientation of the pinned layer, either parallel or anti-parallel to that layer's magnetization. During the read operation a small current is sent through the MTJ junction to sense its resistance which is low for parallel magnetization and high for anti-parallel magnetization. The write operation provides Hs, the magnetic field (via bit/word lines) that is needed to switch between the two states, its magnitude being determined by the anisotropy energy of the element.

The free layer is used during both read and write operations. The cell to be programmed lies at the intersection of a bit and a word line so the fields associated with these bit/word lines can inadvertently affect other cells that lie under them, creating the so-called half-select problem which may cause unintended half selected cells to be accidentally switched.

Another challenge facing this design is that it is very difficult to scale down to smaller dimension since the switching field from the shape anisotropy is inversely proportional to its dimensions (Hs≅MsT/w where w is the smallest dimension of the cell) while the field generated by the current is roughly I/w. The current I provided by its transistor will scale down as w scales down, for future technologies, leaving H roughly constant. Thus for future smaller cells, more current will be needed.

This conventional MRAM design has several shortcomings:

a) Coupling between the free layer and the pin layer, due to the roughness of the oxide layer, is often called the orange peel effect. This coupling induces a bias in the switching threshold of the free layer magnetization. The variation of this coupling thus causes variations in the switching threshold during write operation.
b) The magnetic charges at the edges of the pinned layer also produce a bias. Again, variations of this bias induce variations in the switching threshold.
c) For reliable switching behavior, the ferromagnetic free layer is generally limited to materials with small coercivity. This makes it difficult to use certain materials that have a large magneto-resistive (MR) ratio (Dr/r). For example, CoFeB and CoFe with high Fe concentration have good MR ratios, but are generally poor for magnetic softness.
d) The half select problem discussed above.
e) The scaling down difficulties discussed above.
f) Can only store one bit (in state 0 or 1) per MRAM cell.

An alternative design, called thermal assisted switching (TAS-MRAM), that addresses the half-select and scale-down issues, is illustrated in FIG. 1. In this schematic version, two AFM layers 11 and 15 are seen to be exchange coupled to reference layer 12 and free layer 14, respectively. Separating layers 12 and 14 is dielectric tunneling layer 13. Here, the MRAM is not using shape anisotropy to maintain its stored information. Instead, a second antiferromagnetic layer (AFM), that has a low blocking temperature, is added to exchange bias the free layer.

The free layer magnetization is now determined by this second AFM whose direction is determined by sending a heating current through the cell to heat the cell above the second AFM blocking temperature while not exceeding the first AFM Block temperature. The field generated by the bit line current provides the aligning field for the second AFM during cooling thereby setting the free layer magnetization parallel or anti-parallel to that of the pinned layer.

A transistor is needed for each cell to provide the heating current which eliminates the half select problem since only the selected cell is heated while all the other cells under bit line will have the exchange bias from its second AFM layer unchanged. Also, since the temperature rise due to joule heating is roughly: $\Delta T \cong \rho (I/w)^2/c_p \delta^2$, where $\rho$ is the effective resistivity of the MTJ stack, $c_p$ is the specific heat capacity of the MRAM cell, and $\delta$ is the effective thickness of the MTJ stack. So the temperature rise from the heat current is constant as the dimension scales down. The exchange field on the free layer from AFM2 is also constant if the film thicknesses of the free layer and AFM are not changed.

This TAS-MRAM design has several shortcomings: It does not solve problems a, b, c, or f listed above. Additionally, i) The heating current passes through the MTJ, so the temperature cannot be raised too high without upsetting the first AFM (used for the reference layer).
ii) The MTJ has high resistance which means that the heating current will cause a large voltage across the MTJ, that is likely to break down the tunneling layer (which typically operates below 2 volts, depending on tunneling layer thickness. As density increases, the MTJ resistance needs to be reduced which can only be achieved by an even thinner tunneling layer which means an even lower break-down voltage.
iii) The transistor that provides the heating current may be quite large, making the TAS-MRAM cell very big—not a desirable feature for a high density MRAM design.
iv) The heating current will generate a circumferential field causing the free layer to be in a vortex state. A very large bit line current is needed to remove this vortex.

All of the shortcomings listed above for both designs are solved by the present invention, while maintaining the advantages of TAS-MRAM, as we will disclose in detail below.

A routine search of the prior art was performed with the following references of interest being found:

U.S. Pat. No. 6,806,096 (Kim et al) discloses nitride over the cap layer, oxide fill, and CMP. U.S. Pat. No. 6,881,351 (Grynkewich et al) describes depositing plasma-enhanced nitride, then oxide over the MTJ stack, then CMP. U.S. Pat. No. 6,174,737 (Durlam et al) describes forming a dielectric layer over the MTJ stack and planarizing by CMP. U.S. Pat. No. 6,858,441 (Nuetzel et al) discloses depositing a nitride layer, then a resist layer used in CMP of conductive material forming alignment marks after forming MTJ elements.

U.S. Pat. No. 6,815,248 (Leuschner et al) and U.S. Pat. No. 6,783,999 (Lee) show using nitride or oxide as a fill material over MTJ elements, then CMP. U.S. Pat. No. 6,784,091 (Nuetzel et al) teaches planarizing a blanket nitride layer on top of the MTJ stack.

SUMMARY OF THE INVENTION

It has been an object of at least one embodiment of the present invention to provide a magnetic random access memory element capable of storing more than two information states in a single physical bit.

Another object of at least one embodiment of the present invention has been to provide a memory element whose component parts may be independently optimized with respect to shape, materials, thickness, etc.

A further object of at least one embodiment of the present invention has been that said memory element not require the application of voltages across a tunneling barrier layer that are potentially high enough to damage such a tunneling layer.

A still further object of at least one embodiment of the present invention has been that it be containable within a small unit cell.

Yet another object of at least one embodiment of the present invention has been to provide a method for achieving these goals and a process for manufacturing said memory element.

These objects have been achieved by splitting the free layer of an MTJ MRAM into two separate parts—a read-sensing free layer within an MTJ stack having little or no anisotropy, and an information storage free layer with some anisotropy to provide a field to align the read-sensing free layer. The information storage layer is programmed by thermal assisted writing.

A second bit line is added to the structure. Through control of the respective bit line currents, the direction of magnetization of the free layer is set. This magnetization direction can be changed by small amounts each selected direction representing a different information state of the device. Since the resistance of the MTJ increases as the magnetization of the free layer changes from fully parallel (to the pinned layer) to fully antiparallel, these information states are readily sensed during the read cycle.

In addition to the dual bit lines, there is also a heating line which can be used to heat only a single reference cell during writing or it may be part of a segmented design wherein it also serves as the word line so that several cells are heated at once, making possible a denser structure (since only one heater control transistor is needed per segment).

A number of different embodiments of the invention are described to illustrate the general flexibility of the invention including different modes for heating the reference cell and, for example, using the heating line as one of the bit lines.

BRIEF DESCRIPTION OF THE DRAWINGS

FIG. 1 illustrates a prior art memory element.

FIGS. 2a-2c illustrate the first and second free layers as well as the pinned layer.

FIG. 14 is an eighth embodiment that uses segmented word lines.

DESCRIPTION OF THE PREFERRED EMBODIMENTS

Figure 3:
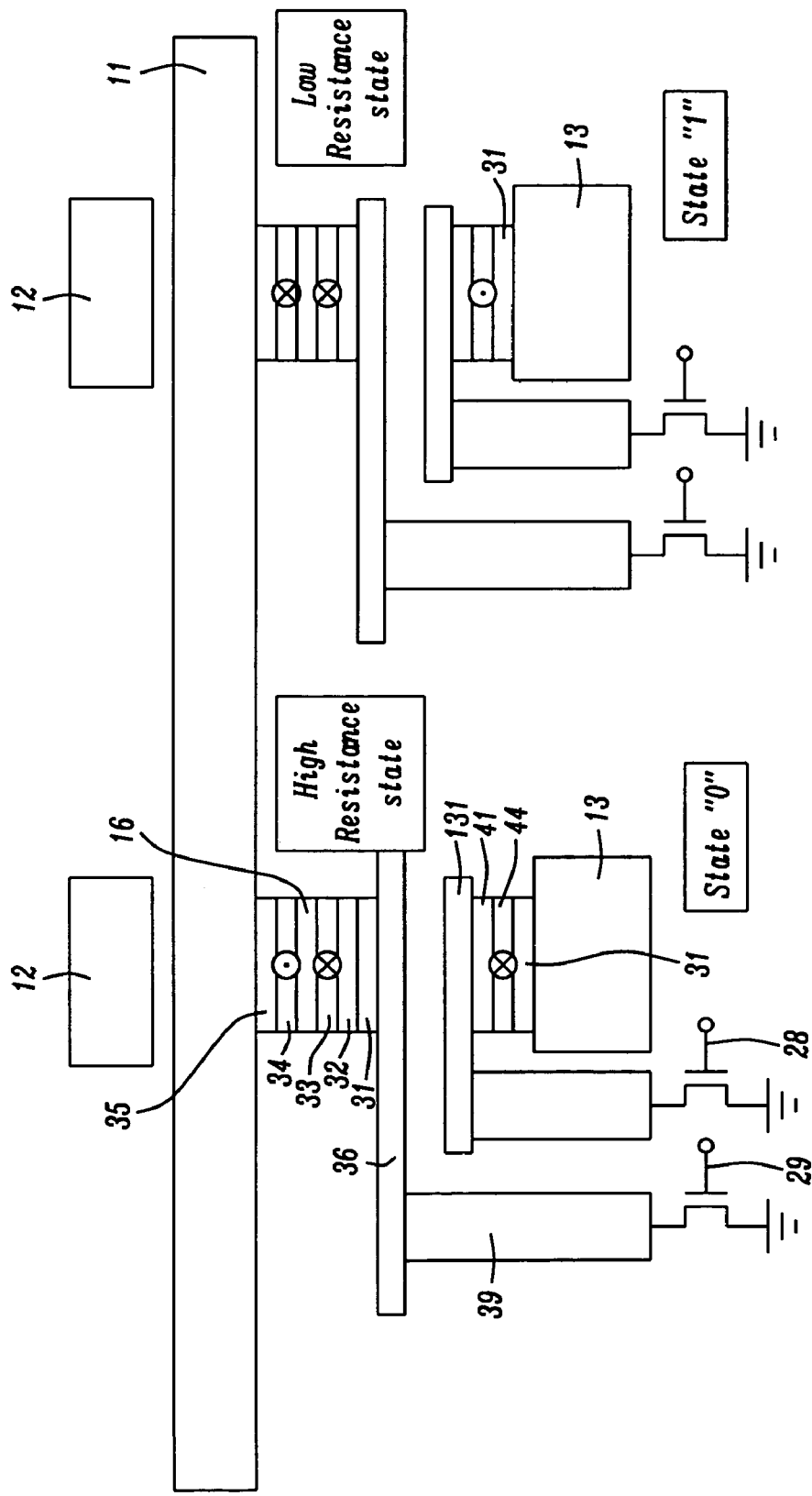
FIG. 3 shows a first embodiment which employs to bit lines, a word line and a heating line.

The present invention, MB-TAISL-MRAM (Multi-Bit-Thermal-Assisted-Integrated-Storage-Layer MRAM) includes separation of the conventional free layer into two parts: a read-sensing free layer and information storage free layer. Free layer 1 is for the read operation. It is part of the MTJ structure but has little or no magnetic anisotropy (by virtue of having a circular shape) so its magnetization will align with any external magnetic field.

Free layer 2, is for the write operation to store the desired digital information as well as to provide a magnetic field from its edge poles that aligns the magnetization of free layer 1. The free layer 2 structure is a simple ferromagnetic layer exchange coupled to a low blocking temperature AFM layer 2 to provide an exchange anisotropy that enables this ferromagnetic layer to maintain its magnetization along a desired direction corresponding to multi-state information (0, 1, 2, 3, or 4) depending on the angle between free layer 2's magnetization, set by AFM2, and that of the pinned layer.

Both free layers have a circular shape and free layer 2 does not have to be part of the MTJ stack. During a write operation, a heating current pulse will pass through free layer 2 and raise its temperature above the blocking temperature of AFM layer 2. Then, free layer 2 will cool down under the combined fields of the bit and word lines with a field direction dependent on the relative strengths and directions of their two fields.

An important innovation, disclosed with the present invention In addition to the above features, is the introduction of a second bit line whose purpose is to facilitate precise control of the direction of magnetization of the second free layer. After the fields derived from the word line and the two bit line currents have been removed, this magnetization (of free layer 2) will maintain its direction through the exchange anisotropy provided by AFM layer 2. The magnetostatic field from free layer 2's edge poles will align the free layer 1 magnetization antiparallel to the magnetization direction of free layer 2.

So the free layer 1 magnetization will be at an angle relative to that of the pinned layer. The magnitude of this angle will determine the MTJ resistance which will increase as this angle increases (up to a maximum of 180 degrees). The relationship between this angle and the tunneling resistance, $R_{MTJ}$, is readily computed according to the following formula:

$R_{MTJ=Rp}+\Delta_R \times (1+ \cos(\theta_{fr1}-\theta_{pin})/2$ where $R_p$ is the resistance when free layer 1 and the pinned layer are exactly parallel.

Assume $\theta_{pin}=0$, then $R_{MTJ}=R_F+\Delta_R\times(1+ \cos(\theta_{fr1})/2$ implying a state of the device that can be stored in the MTJ cell and later recognized by reading the MTJ resistance, provided care is taken in choosing the angle of free layer 1 relative tp that of free layer 2. The resulting possibilities for an 8 state cell design are summarized in TABLE 1:

TABLE I

| $\theta_{fr1}$ | $R_{MTJ}$ |
| --- | --- |
| 0 | $R_p$ |
| 41.4 | $R_p + \Delta R/8$ |
| 60 | $R_p + 2 \times \Delta R/8$ |
| 75.5 | $R_p + 3 \times \Delta R/8$ |
| 90 | $R_p + 4 \times \Delta R/8$ |
| 104.5 | $R_p + 5 \times \Delta R/8$ |
| 120 | $R_p + 6 \times \Delta R/8$ |
| 138.6 | $R_p + 7 \times \Delta R/8$ |
| 180 | $R_p + \Delta R$ |

If we reserve $R_p+4\times\Delta R/8$ to be the reference level for the sense amplifier, that leaves 8 states per cell. Note the various resistance levels do not have to be equally spaced, Furthermore, even more states per cell are possible by choosing a smaller value for $\theta_{fr1}$. The number of states that can stored per cell is limited only by how high Dr/r can be and by the resolution of the Sense Amplifier. e.g. A Dr/r=20% is needed for Rp-sigma/Rp=1.0%.

We note here that if the number of possible states per cell is 10 (or more) it becomes possible to perform decimal arithmetic directly in such a system without the need to move back and forth to binary. If 16 or more states can be stored then direct execution of hexadecimal arithmetic becomes possible, and so on. Similarly, this ability to store many states in a single physical location could be applied to very high density storage of data.

Currently, the highest Dr/r available is 27.8% for the CoFeB/MgO MTJ system. Dr/r drops by roughly 200% at a reading bias voltage of 300 mV, implying that 10 states (200%/20%) could be stored in one cell using this design.

In FIGS. 2a-2c we illustrate, schematically, how one of the possible multi states can be stored in the cell. The current through the first bit line can be unidirectional but the current through the second bit line has to be bi-directional. The current levels for both bit lines need to be adjustable so as to be able to steer free layer 2's magnetization into the desired direction.

Free layer 1 can also be a super-paramagnetic layer (thickness thinner than a critical value so it has Dr/r but no measurable moment at room temperature) has no (or very little) residual magnetization in the absence of an external field, and has a magnetization substantially proportional to the external field in any orientation.

There are multiple ways to embody above MB-TAISL-MRAM design, including both heating-current-in-the-film-plane (HCIP) and heating-current-perpendicular-to-the-film-plane (HCPP) designs for the storage element (free layer 2).

1$^{st}$ Embodiment

Referring now to FIG. 3, we show there two storage elements, of the HCPP type, each addressed by conventional orthogonal word line 13 and bit line 11. Additionally (and key to the invention), second bit line 12 is seen to be located above, and parallel to word line 13. Closest to second bit line 12 is the conventional MTJ structure including seed layer 31, first AFM layer 32, pinned layer 33, dielectric tunneling layer 16, first free layer 34 (for the read operation), and capping layer 35. Below this, resting on word line 13, is the storage structure consisting of second free layer 44, and second AFM layer 41.

Two memory cells are shown, one in each of the two possible states. Transistor 28 is used to provide the heating current for layer 44 (free layer 2) which current is carried by word line 13. Transistor 29, connected to stud 39, serves to control the measurement of the MTJ resistance.

Figure 4:
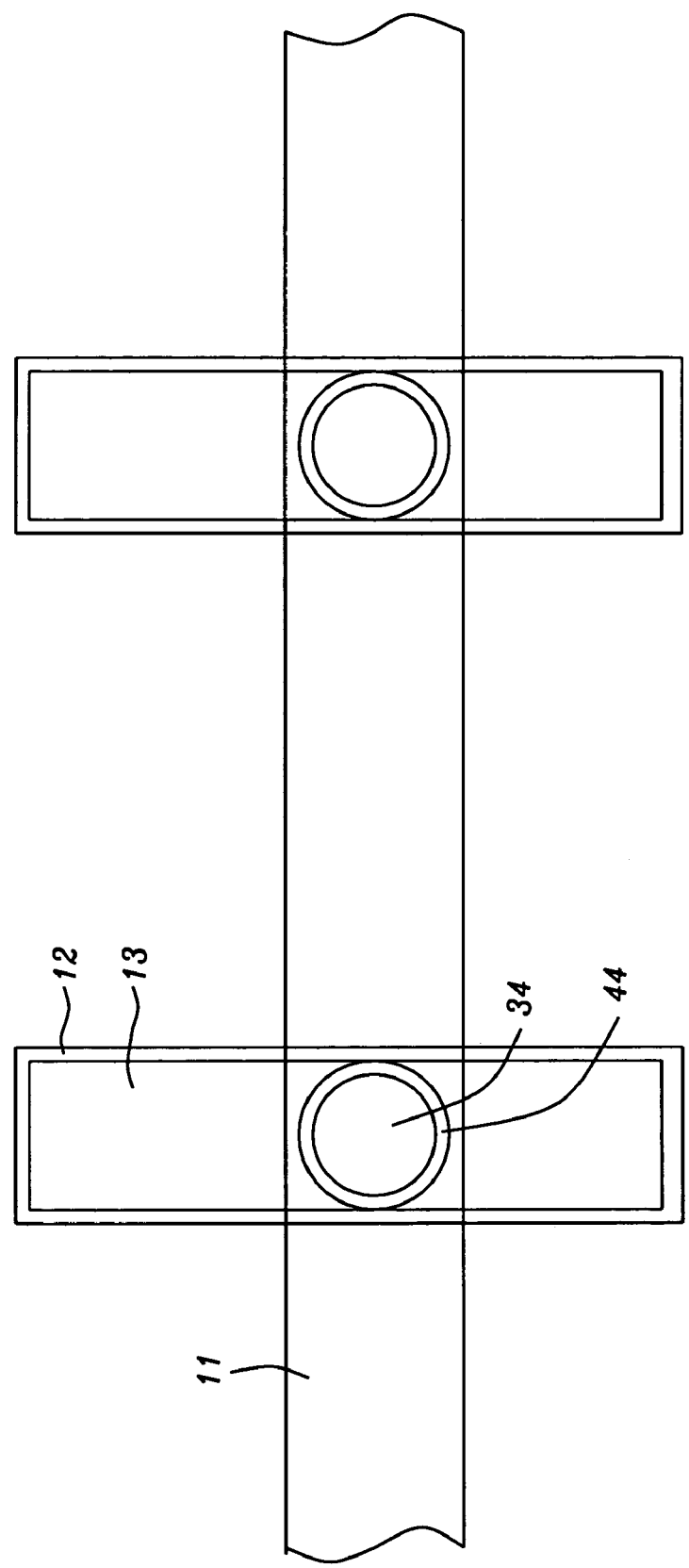
FIG. 4 is a simplified plan view of FIG. 3.

Read sensing element 34 (free layer 1) is seen in FIG. 4 to be a circular MTJ structure. Storage element 44 (free layer 2) has a circular shape and is a simple ferromagnetic layer with low-blocking temperature AFM layer 41 (AFM2) on it.

It is a key feature of the invention that, since the read-sensing and information storage functions derive from different layers, each can be optimized independently. The materials chosen for each free layer can be very different. For example, free layer 1 can be optimized for high dr/r by using materials like CoFeB, CoFe or NiFe with high Fe content while the material for free layer 2 can be selected for its switching behavior or for having a high exchange bias field. As a result, the storage element can be a simple ferromagnetic layer plus an AFM layer with low blocking temperature, thereby eliminating undesirable effects on switching behavior from Néel field coupling in the MTJ stack and the residual demagnetization field from the pinned layer edge.

Since there is no MTJ on free layer 2, there is no tunneling layer to be broken down. Also, heating is centered some distance away from AFM layer 21, thereby reducing the chances of disturbing it during a write operation. AFM 22 can be a metal alloy like IrMn, PtMn, OsMn, RhMn, FeMn, CrPtMn, RuMn, ThCo, etc or an oxide like CoO, NiO, CoNiO.

Also seen in FIG. 3 are capping layer 35, seed layer 31, electrode 36, and pinned layer 33.

2$^{nd}$ Embodiment

Figure 5:
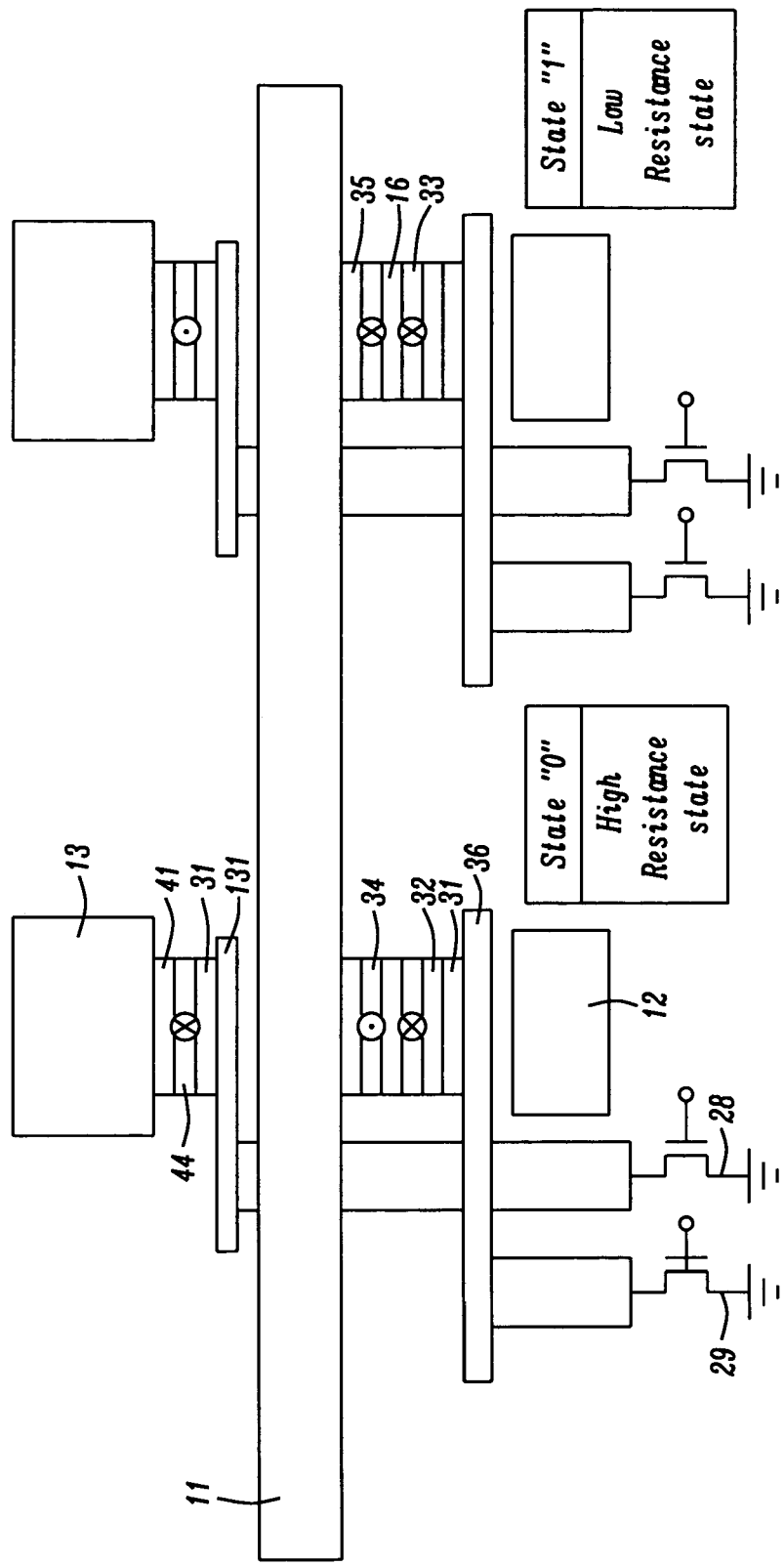
FIG. 5 shows a second embodiment in which the heating current passes through the word line.

This resembles the 1$^{st}$ embodiment except that the relative positions of the two free layers, as well as that of bit line 12 and word line 13 have been switched. Thus, as seen in FIG. 5, free layer 2 lies directly between bit line 11 and word line 13, thereby reducing the current strength needed for writing, relative to embodiment 1. As in embodiment 1, the heating current is controlled by transistor 28 and is carried by word line 13.

3rd Embodiment

Figure 6:
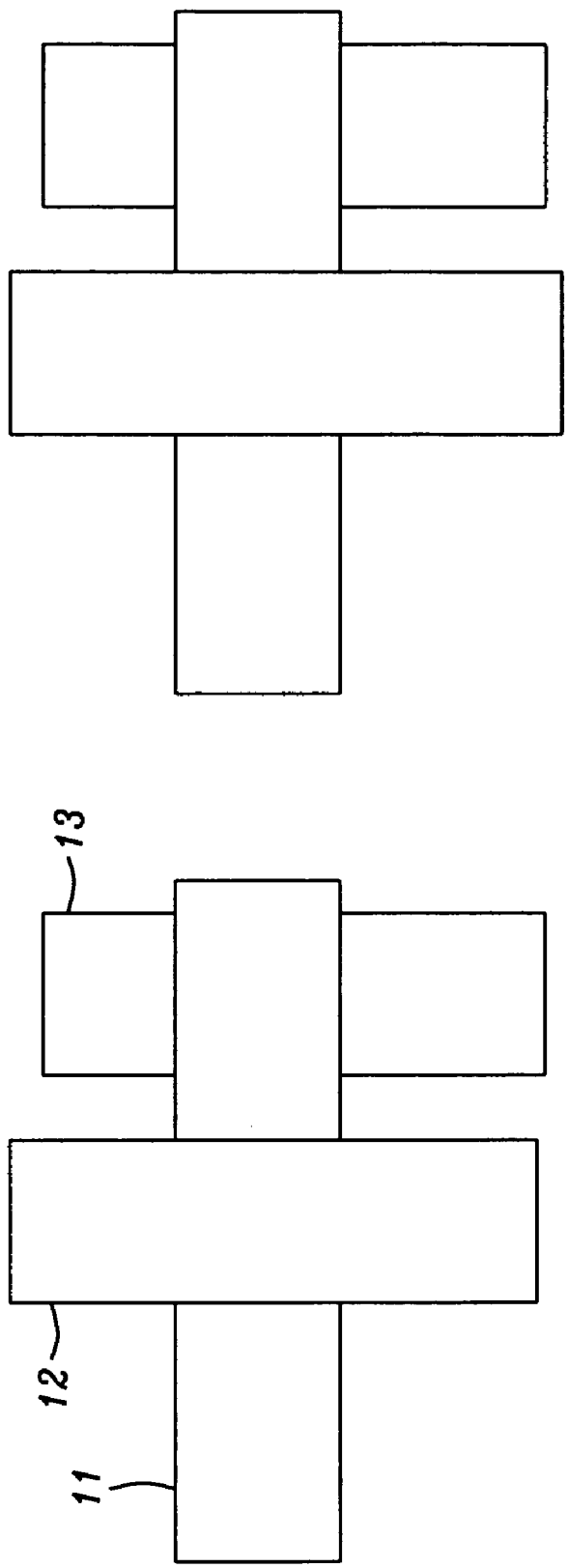
FIG. 6 is a partial plan view of FIG. 7.

Referring next to FIG. 6, we show there an arrangement of the word line and the two bit lines which benefits from being formed through a self-aligning process because it causes free layer 2 to be an integral part of the heating line, thereby increasing heating efficiency.

Figure 7:
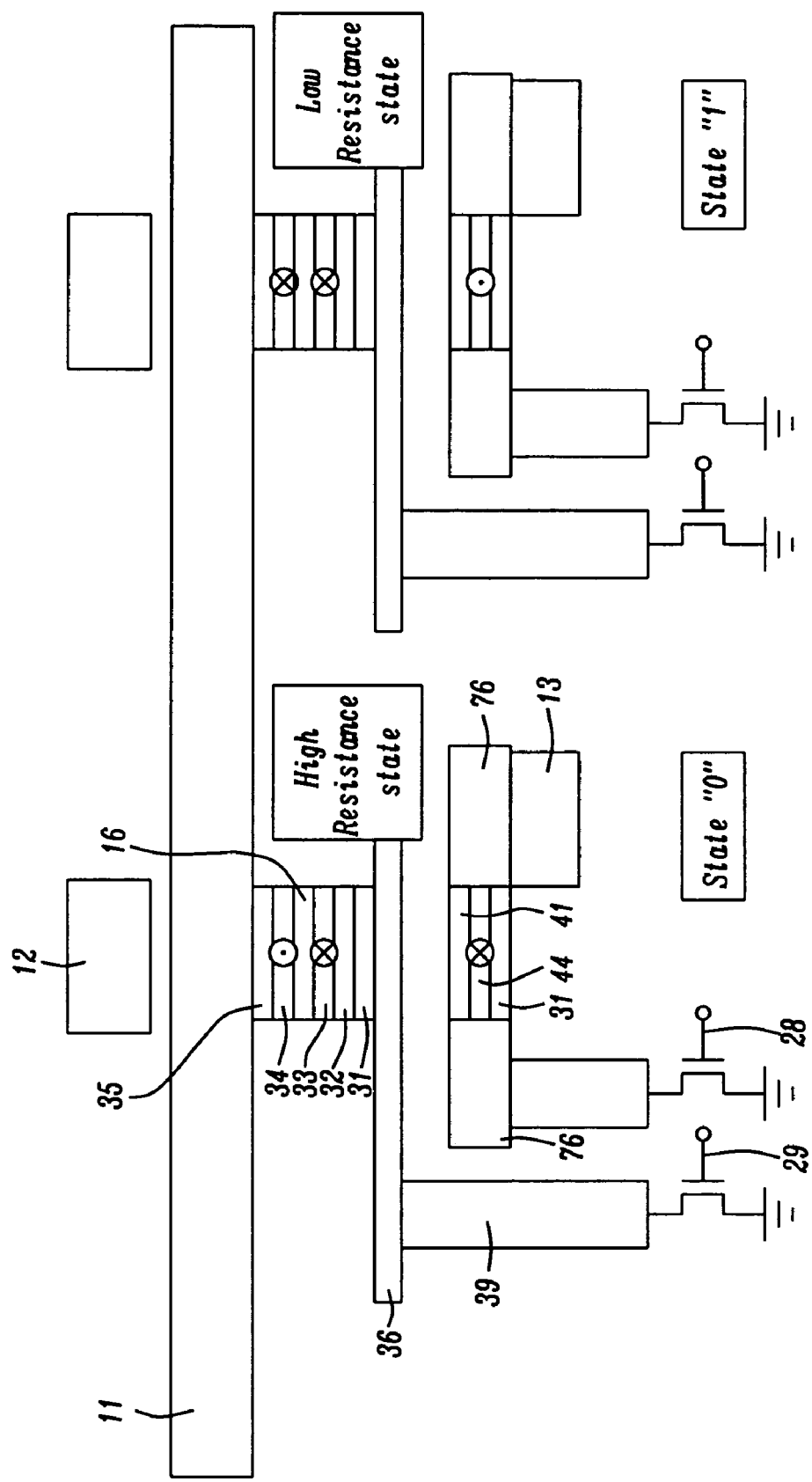
FIG. 7 shows a third embodiment in which the heating current is directed to flow parallel to the plane of AFM2 by using butted end contacts.

In FIG. 7 it can be seen that this embodiment is of the HCIP type. As in the first embodiment, the read and storage structure structures are vertically aligned but heating of the latter is achieved by means of second electrode 76 which makes butted end connection to layer 44 (as well as to layers 31 and 41), so the heating current flows from transistor 28 through word line 13.

4th Embodiment

Figure 8:
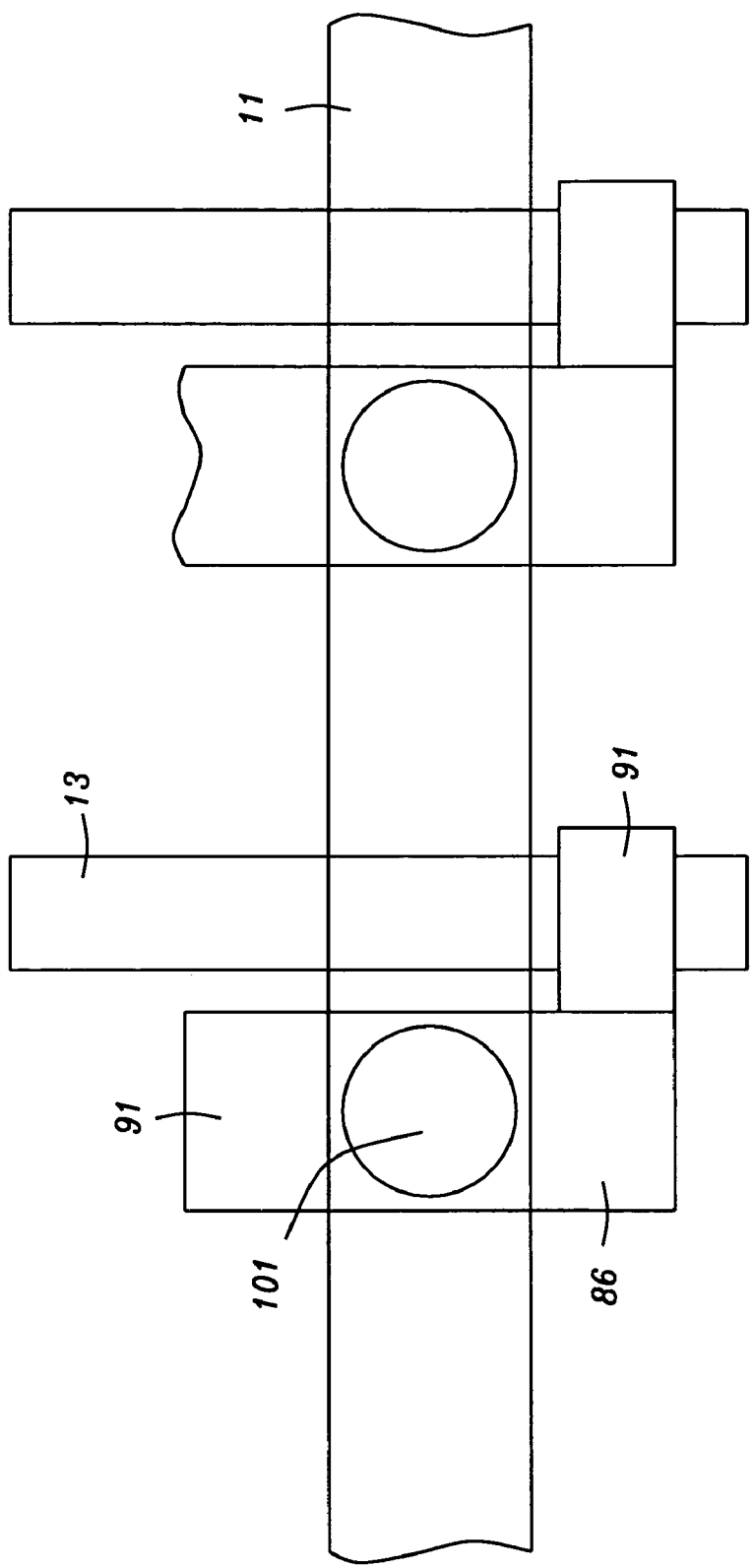
FIG. 8 is a partial plan view of FIG. 9.
Figure 9:
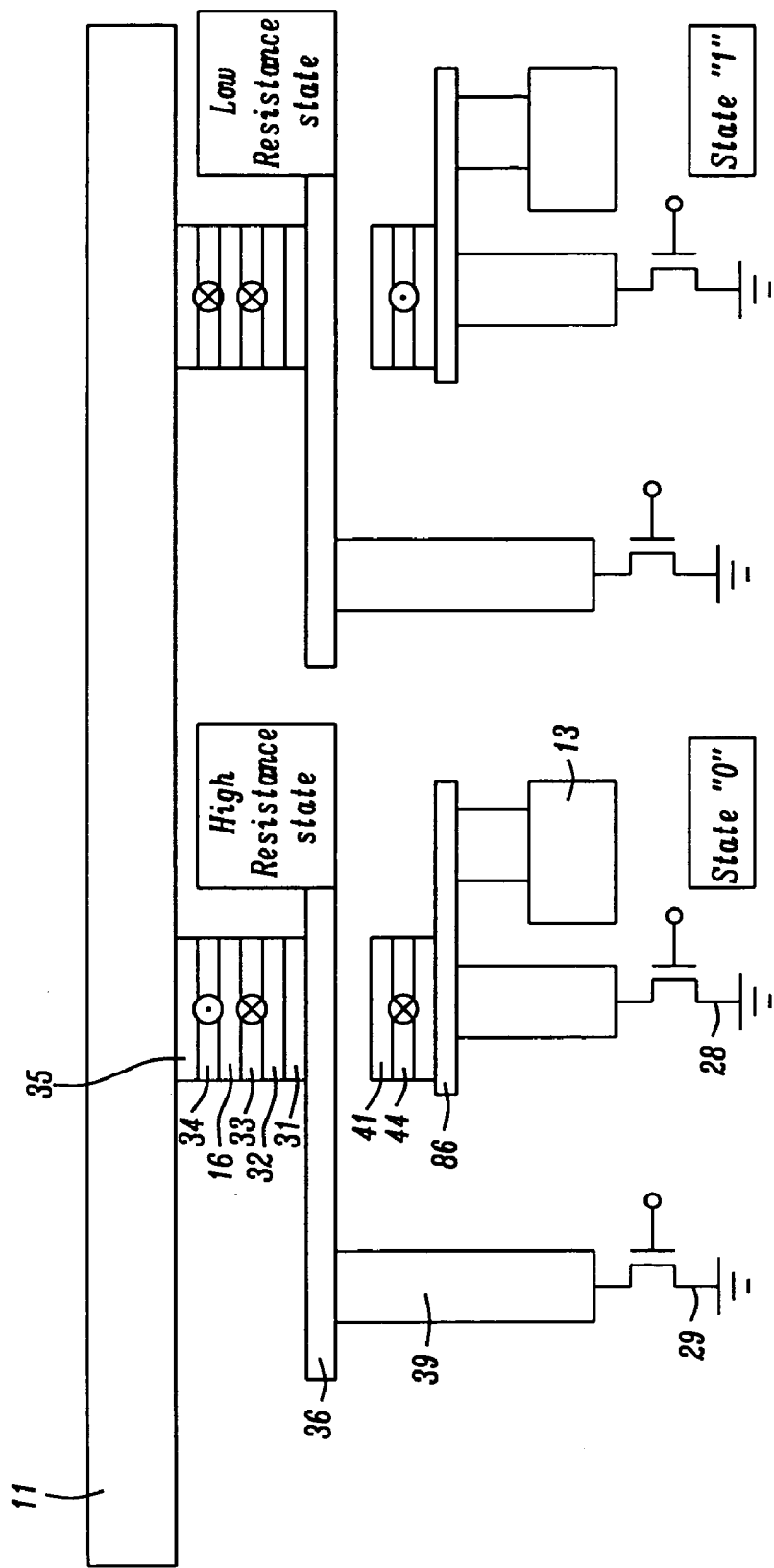
FIG. 9 shows a fourth embodiment in which the heating line also serves as the second bit line.

Embodiment 4 is illustrated in FIGS. 8 and 9. It is similar to the first embodiment except that only a single bit line is needed (line 11) and word line 13 has been moved to one side so the heating current passes from transistor 28 through bottom electrode 86, by way of studs 91, and out through word line 13. This is thus an example of a HCIP type of design.

The reason that only a single bit line is needed is because writing can be accomplished by using appropriate waveforms for the heating and bit line currents. As can be seen in FIG. 8, the current through bottom electrode 86 runs at right angles to the current through bit line 11 so the magnetic field associated with the heating current will combine with that of bit line 11 to determine the direction of magnetization that will be induced in free layer 2 (layer 44).

Figure 12:
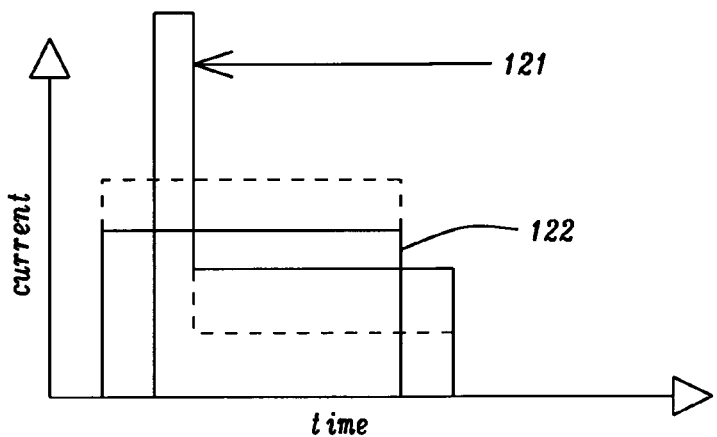
FIG. 12 illustrate how correct choice of the waveforms for the heating and bit line currents allows only a single bit line to be used.

As shown in FIG. 12, bit line current 122 is initiated first followed (within about 10-100 nanoseconds) by heating current 121. The latter has the form of a high current pulse (about 5-20 nanoseconds wide) that generates the heating current, followed by a constant current level whose value is comparable to that of the bit current, lasting about 10-90 nanoseconds which is sufficient time for the magnetization of layer 44 to be established while AFM 2 (layer 41) is above its blocking temperature and to then be 'frozen in' as it cools below this. Two different current levels are depicted (solid and dotted lines).

The only constraint is that the bit line current has to be bidirectional (while the heating current can be one directional). These two currents must, of course, be available at multiple levels to be able to determine the direction of free layer 2's magnetization.

5th Embodiment

Figure 10:
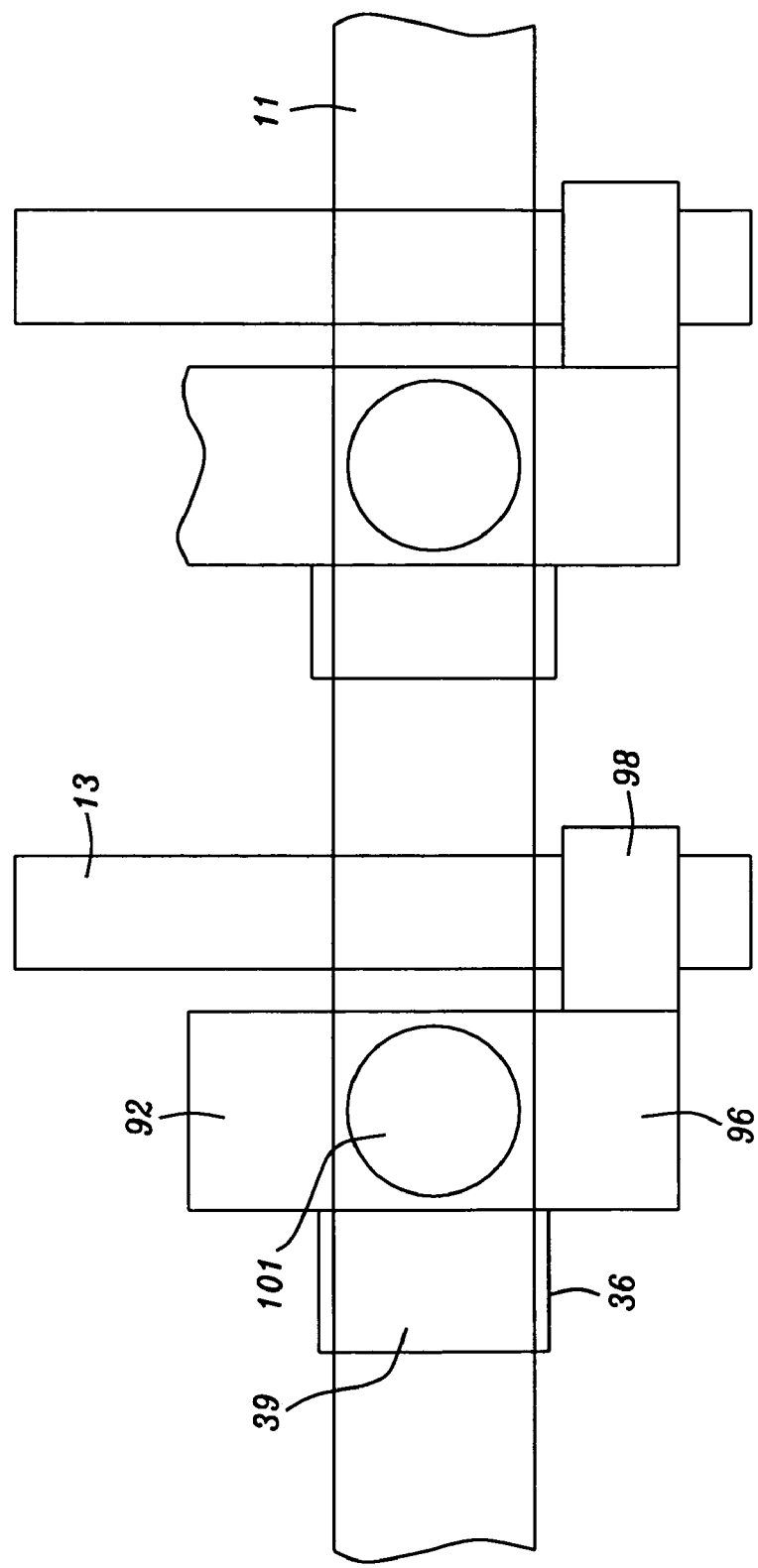
FIG. 10 is a partial plan view of FIG. 11.
Figure 11:
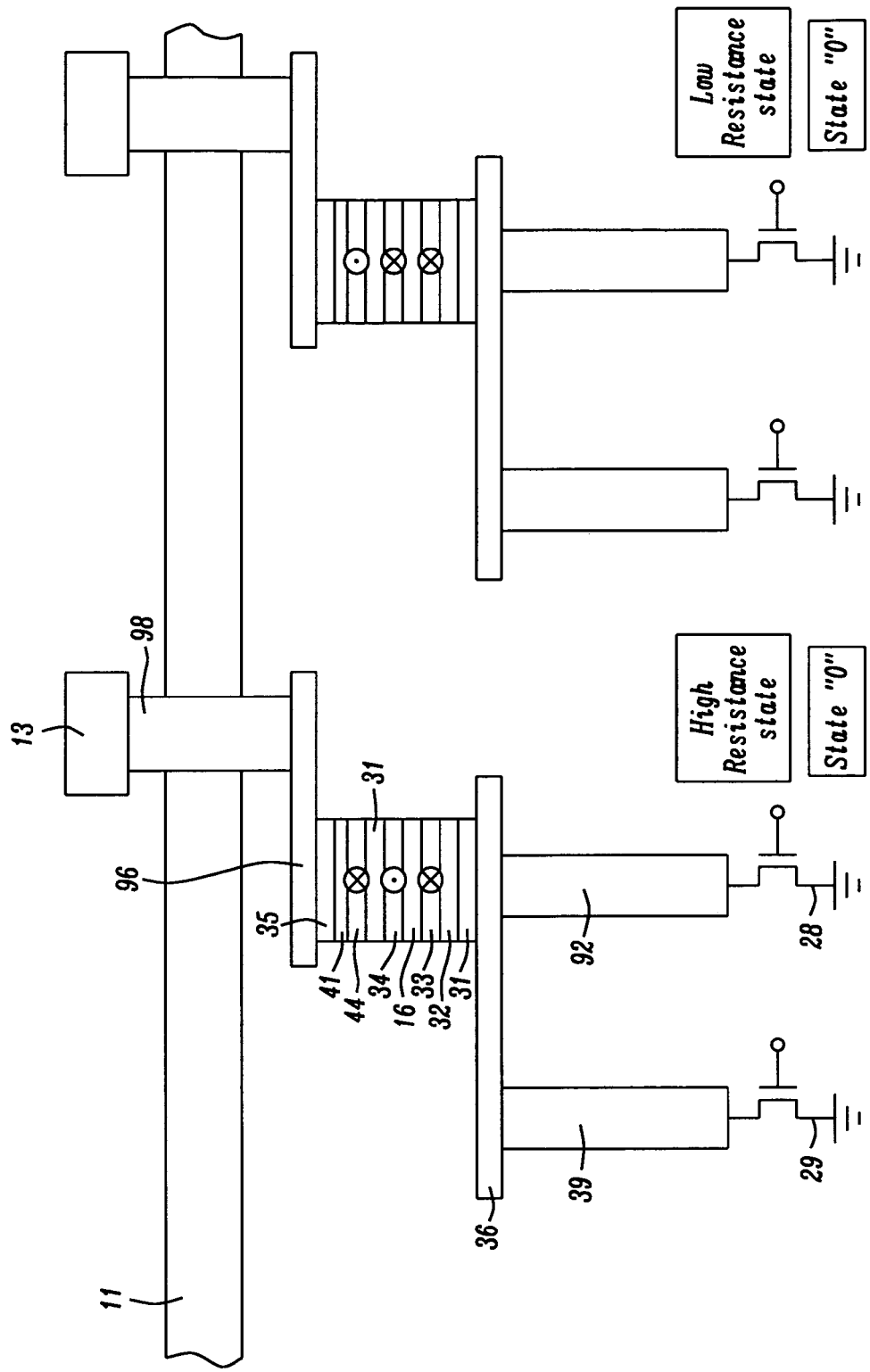
FIG. 11 shows a fifth embodiment in which the MTJ and the reference stack form a single structure and the heating line also serves as the second bit line.

As seen in FIGS. 10 and 11, the data storage element has been placed directly above, and in contact with, the MTJ and is heated by top electrode 96. Current through the latter goes from transistor 28, through stud 92 (which does not touch the MTJ stack but extends past and behind it), then leaves through word line 13 by way of stud 98.

As was the case for embodiment 4, only a single bit line (line 11) is required. Since the current through bottom electrode 96 is orthogonal to the bit line current (see FIG. 10) the heating current may be used, in combination with the bit line current, to determine the direction of magnetization induced in free layer 2 (layer 44). The same constraints discussed for embodiment 4, directionality, waveform, and multi-valued bit currents, apply here as well.

6th and 7th Embodiments

These are not explicitly shown here since they are similar to embodiments 3 and 4 but having the storage element located above bit line 11 (AND BELOW BIT LINE 12?), isolated from bit line 11, in a similar manner to embodiment 2 (FIG. 7). The heating current in these embodiments goes from transistor 28, through butted contacts 76 (FIG. 7), and out through word line 13, in the case of embodiment 6; and out through word line 13 by way of bottom electrode 86 and studs 91 (FIG. 9) in the case of embodiment 7.

8th Embodiment

Figure 13:
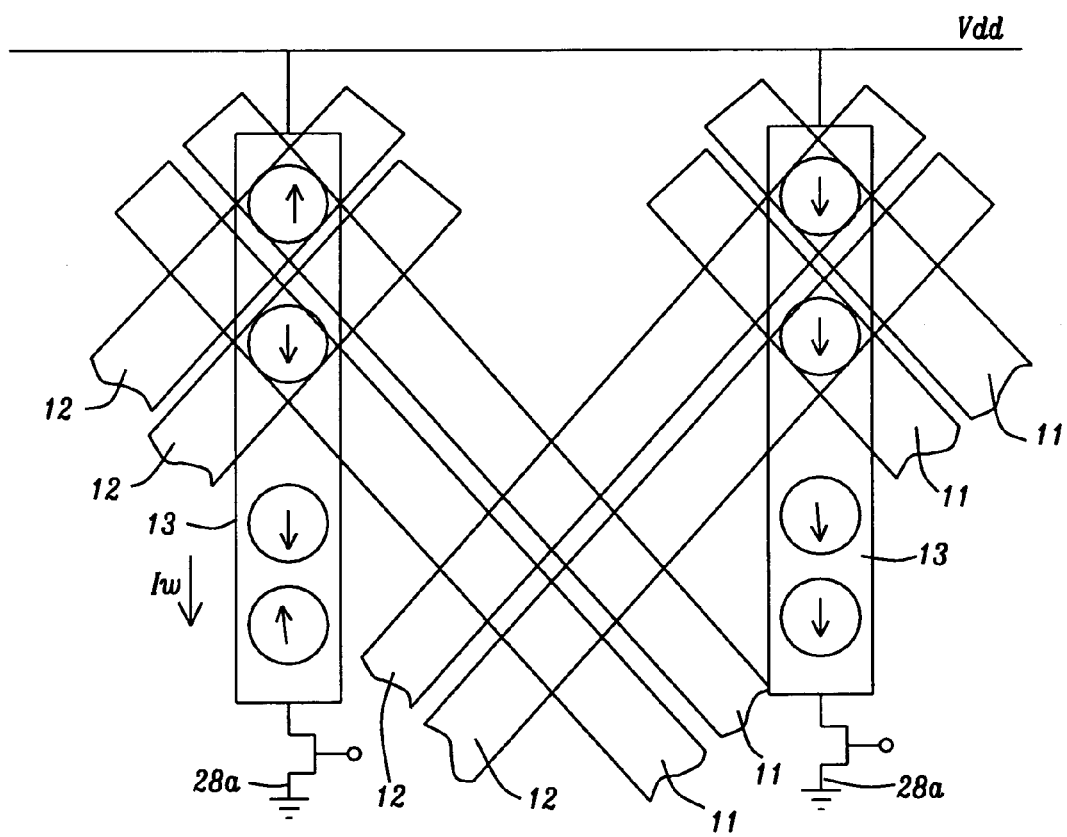
FIG. 13 illustrates the segmented word/heating line configuration in which one transistor controls the heating of a number of reference stacks.

The heating control transistor may be rather large if the heating current is large, thereby making the cell large. To save space (particularly for high density designs) a single heating control transistor can be shared by a number of cells by using a segmented heating line approach. A schematic overview of segmented heating lines is shown in FIG. 13 where word line 13, serving several storage cells, is controlled by single transistor 28a. These multiple storage elements (free layer 2) MRAM cells are connected by one heating line and are written simultaneously during a write operation. Cell storage element magnetization within each group is determined by the sum of the fields from the two bit lines. These are orthogonal to each other but oriented at 45 deg with respect to the heating current line direction.

Embodiments 8-17 utilize this technique. Embodiment 8 is shown in FIG. 14. It can be seen that it bears some similar to embodiment 4 (FIG. 9). The read current passes through first bit line 11 while heating line 131 also serves as the word line. Heating line control transistor 28a is not seen in the drawing since it lies out of its plane.

9th Embodiment

Figure 15:
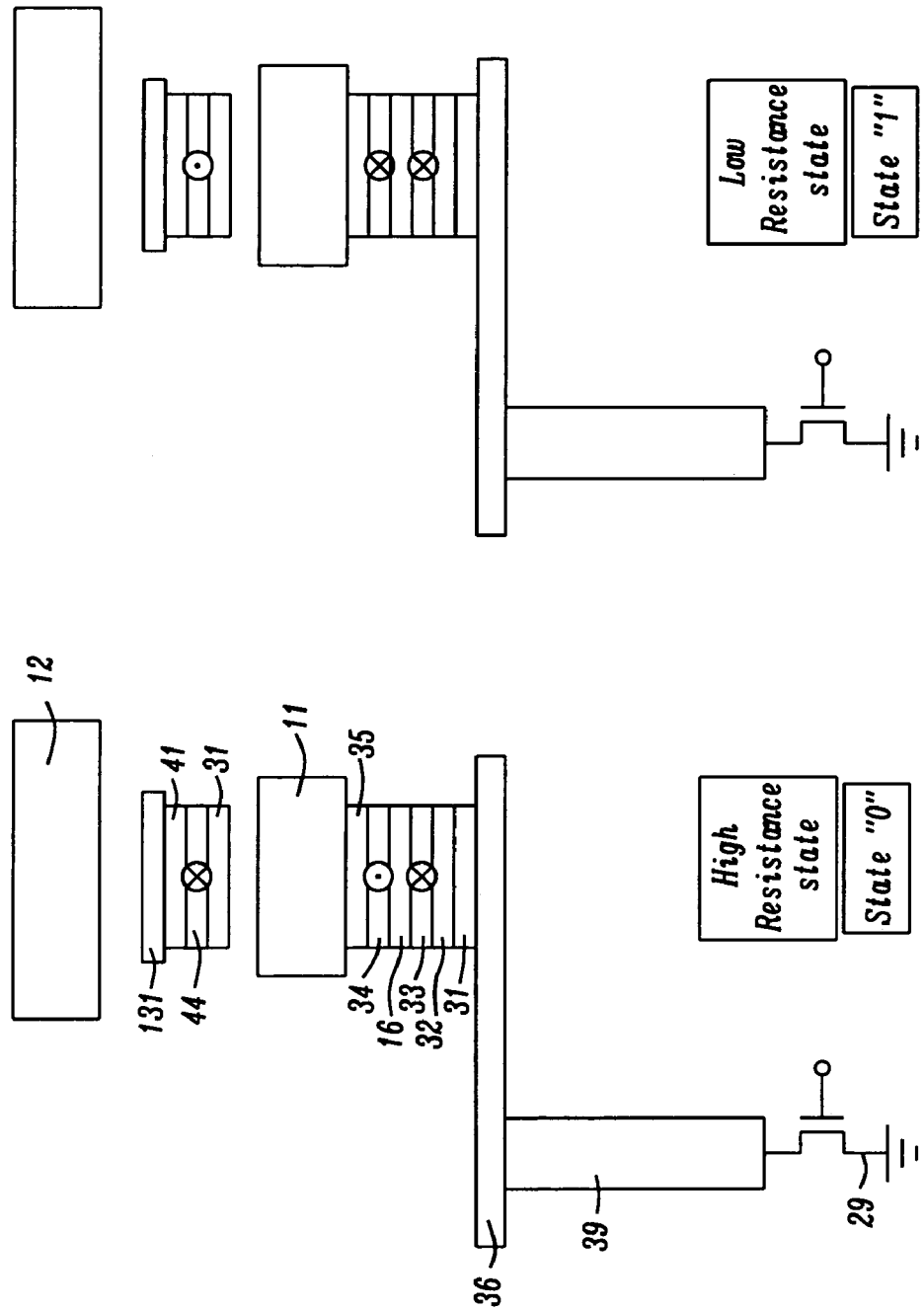
FIG. 15 is similar to FIG. 14 except that the relative positions of the two stacks have been reversed.

This is illustrated in FIG. 15. It is readily seen to be similar to embodiment 8 except that the storage element is now located between bit lines 11 and 12.

10th and 11th Embodiments

Figure 16A:
FIGS. 16a and 16b illustrate use of a self-aligned process to form the stacks so that they are embedded in the heating line.
Figure 16B:

These are similar to the 8th and 9th embodiments except that the storage element and the heating line are formed by a self-aligning process:

(i) After free layer 2 is deposited, it is patterned and etched (Reactive Ion or Ion Beam etching) into the desired shape(s);

(ii) with the photoresist mask still in place, the heating line layer is deposited;

(iii) the heating line is now patterned and etched (using an additional mask); and (iv) all photoresist is stripped, resulting in liftoff of heating line material that is directly over the free layer areas. The final result is as illustrated in FIGS. 16a (plan view) and 16b (cross-section).

Figure 17A:
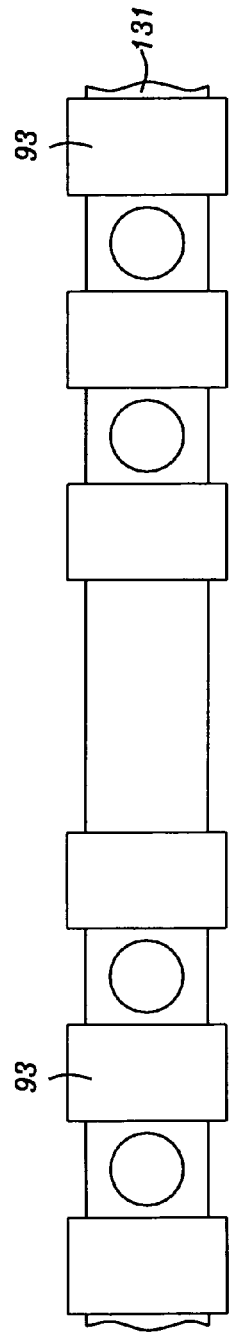
FIGS. 17a and 17b show how the line resistance of the structure shown in FIGS. 16a and 16b can be reduced.
Figure 17B:
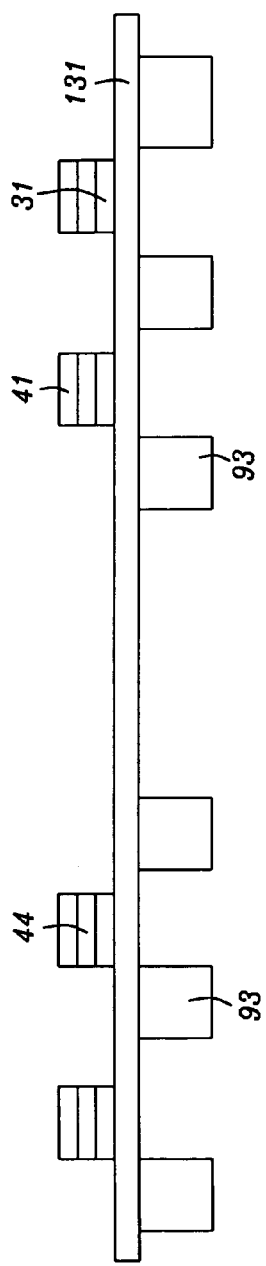

The heating line is usually made of high resistivity material such as Ta, W, alloys, semiconductors like nitrides, doped oxides, or polycrystallines. To enhance the efficiency of the heat line, highly conductive metal blocks 93 (Cu, Au, Al etc.) can be superimposed to contact the heat line wherever there are no MRAM cells. This is illustrated in FIGS. 17a and 17b (for the self-aligned case). Embodiments 12-15 are thus embodiments 8-11 with this additional feature added as part of their structure.

Additional Refinements:

To minimize the possible influence of stray fields from the pinned layer magnetization on free layer 1, the net pinned layer magnetic moment can be minimized by making it in the form of a synthetic AFM structure wherein the single pinned ferromagnetic layer is replaced by at least two ferromagnetic layers, separated by AFM coupling metals such as Ru and Rh, of precise thickness, such that the two ferromagnetic layers are strongly coupled to each other in an anti-parallel configuration.

It will also be obvious to those skilled in the art that the single storage layer described above in the interests of clarity, can be replaced by a laminate of several layers, such as in a synthetic structure. The same goes for the pinned layer, from which an antiferromagnetic layer to fix the pinned layer has been omitted for brevity.

Free layer 1 can also have the form of a super-paramagnetic layer, whose remnant magnetization is substantially zero with the absence of external field, and whose magnetization is roughly proportional to the external field until reaching a saturation value. This super-paramagnetic free layer can be a free layer consisting of nano-magnetic particles isolated from each other with no exchange coupling between them.

As an example, one can use the same ferromagnetic material as in a conventional MTJ, but at a thickness that is below some critical value. Below this critical thickness the film may become discontinuous, resembling a nano-magnetic layer with isolated magnetic particles. To maintain a high MR ratio, multiple layers of such nano-magnetic layers become advantageous. Additionally, materials that promote grain separation may be added as thin layers between such laminated magnetic layers to further isolate the magnetic nano particles.

What is claimed is:

1. A method to write and store information in a MRAM, comprising:
    providing a MTJ stack, including a first free layer, a first AFM layer, and a pinned layer that is magnetized in a fixed direction;
    providing a magnetic reference stack, including a second free layer that is exchange coupled to a second AFM layer having a blocking temperature;
    positioning said MTJ and magnetic reference stacks so that said first free layer is magnetostatically coupled to said second free layer;
    providing first and second bit lines that intersect and are orthogonal to one another;
    providing a word line that is not parallel to either bit line and that passes through said intersection;
    positioning said magnetic reference stack to be at said intersection;
    while heating said second AFM layer to a temperature above said blocking temperature, passing first and second electric currents, each current having a value that is one of a number of possible values, through said first and second bit lines respectively, thereby magnetizing said second free layer in a direction;
    through control of said current values, setting the direction of magnetization of the second free layer to be in one of said number of possible values; and
    then, while said bit and word line currents are still present, allowing said second AFM layer to cool to a temperature below said blocking temperature whereby said second free layer remains magnetized in said direction.

2. The method of claim 1 wherein said number of possible values is at least 10 whereby each single MRAM cell can store a decimal integer, thereby enabling said MRAM to directly perform decimal arithmetic.

3. A method to write and store information in a MRAM, comprising:
    providing a MTJ stack, including a first free layer, a first AFM layer, and a pinned layer that is magnetized in a fixed direction;
    providing a magnetic reference stack, including a second free layer that is exchange coupled to a second AFM layer having a blocking temperature;
    positioning said MTJ and magnetic reference stacks so that said first free layer is magnetostatically coupled to said second free layer;
    providing bit and word lines that are orthogonal to one another;
    providing a heating line that is orthogonal to and intersects said bit line;
    positioning said magnetic reference stack to be at said intersection;
    while passing a first current through said bit line, passing through said heating line a current pulse of higher value than said first current, thereby heating said second AFM layer to a temperature above said blocking temperature;
    then passing through said heating line a current of comparable value to said first current, thereby magnetizing said second free layer in a direction;
    then, while said bit and heating line currents are still present, allowing said second AFM layer to cool to a temperature below said blocking temperature whereby said second free layer remains magnetized in said direction.

4. The method described in claim 3 wherein said current pulse lasts for between about 10 and 100 nanoseconds and said bit line current is between about 0.1 and 10 amps.

5. A magnetic random access memory, comprising:
    on a first substrate, an MTJ stack that further comprises
    a first seed layer;
    a first AFM layer on said first seed layer;
    a pinned layer on said first AFM layer;
    a dielectric tunneling layer on said pinned layer;
    a first free layer on said dielectric tunneling layer, and
    a capping layer on said first free layer;
    on a second substrate, a magnetic reference stack that further comprises:
    a second seed layer;
    a second free layer on said second seed layer, and
    a second AFM layer on said second free layer;
    said magnetic reference stack being positioned so that said second free layer is magnetostatically coupled to said first free layer;
    a heating line that is in thermal contact with said reference stack;
    orthogonally disposed first and second bit lines and a word line that is not parallel to either bit line, all three lines intersecting at said magnetic reference stack;
    a first transistor that is connected to said heating line to control current flow through said heating line; and
    a second transistor that is connected to said MTJ stack to enable measurement of said MTJ stack's electrical resistance.

6. The magnetic random access memory described in claim 5 wherein materials that comprise said MTJ stack have optimum properties that are independent of one another.

7. The magnetic random access memory described in claim 5 wherein:
said MTJ stack is optimized for maximum dr/r;
said magnetic reference stack is optimized to have a maximum exchange bias field;
said second free layer is a simple ferromagnetic layer;
said second AFM layer has a blocking temperature that is less than about 200° C.; and
said second AFM layer is selected from the group consisting of IrMn, PtMn, OsMn, RhMn, FeMn, CrPtMn, RuMn, ThCo, CoO, NiO, and CoNiO.

8. The magnetic random access memory described in claim 5 further comprising:
said word line being said second substrate;
said MTJ stack being over said magnetic reference stack;
said heating line being in thermal contact with an upper surface of said second AFM layer;
a lower electrode of said MTJ stack being said first substrate;
said first bit line contacting said capping layer; and
said second bit line lying above said first bit line.

9. The magnetic random access memory described in claim 5 further comprising:
said magnetic reference stack being over said MTJ stack and said heating line being said second substrate;
said word line contacting an upper surface of said second AFM layer;
said first substrate being a lower electrode of said MTJ stack;
said first bit line contacting said capping layer and being disposed to lie between said MTJ and magnetic reference stacks; and
said second bit line being disposed to lie below said lower electrode.

10. The magnetic random access memory described in claim 5 further comprising:
said first substrate being a bottom electrode of said MTJ stack;
said first bit line contacting said first capping layer;
said second bit line lying above said first bit line;
said second substrate being a dielectric surface located below said bottom electrode;
first and second connectors that make butted contact to, respectively, first and second opposing ends of said of said reference stack;
a stud that connects said first connector to said first transistor; and
an upper surface of said word line contacting a lower surface of said second connector, whereby said connectors serve as said heating line in a HCIP configuration.

11. The magnetic random access memory described in claim 5 further comprising:
said MTJ stack being disposed to lie over said magnetic reference stack;
said first substrate being a bottom electrode of said MTJ stack;
said first bit line contacting an upper surface of said capping layer;
said heating line serving as both said second substrate and as said second bit line; and
said heating line being connected to said first transistor and to said word line.

12. The magnetic random access memory described in claim 5 further comprising:
said MTJ stack being disposed to lie directly below, and in contact with, said magnetic reference stack whereby said second substrate is a top surface of said capping layer;
said first substrate being a bottom electrode of said MTJ stack;
said first transistor being connected to said bottom electrode in an area that is overlapped by said MTJ stack;
said second transistor being connected to said bottom electrode in an area that is as far removed from said MTJ stack as space permits;
said heating line contacting a top surface of said reference stack; and
said heating line being connected to said word line.

13. The magnetic random access memory described in claim 5 further comprising:
said first substrate being a lower electrode of said MTJ stack and said magnetic reference stack being under said MTJ stack;
said first bit line contacting a top surface of said capping layer;
said second bit line being above said first bit line;
said second substrate being said heating line which is also said word line; and
said word line being configured as multiple segments each of which, when energized, will simultaneously heat a number of reference stacks, each word line segment being connected to a single instance of said first transistor.

14. The magnetic random access memory described in claim 13 wherein said number of reference stacks heated by a single segment is between about 1 and 1,024.

15. The magnetic random access memory described in claim 5 further comprising:
said first substrate being a lower electrode of said MTJ stack and said magnetic reference being over said MTJ stack;
said first bit line contacting a top surface of said capping layer;
said second substrate being a dielectric layer that is over said first bit line;
said heating line contacting an upper surface of said second AFM layer and serving as said word line;
said second bit line being above said heating line; and
said heating line being configured as multiple segments each of which, when energized, will simultaneously heat a number of reference stacks, each word line segment being connected to a single instance of said first transistor.

16. The magnetic random access memory of claim 15 wherein regions of conductive material, selected from the group consisting of Ag, Cu, Au, and Al, are included as part of said segmented heating line, thereby reducing overall electrical resistance of said segmented heating line.

17. The magnetic random access memory of claim 5 wherein each of said MTJ stacks, acting together with its associated magnetic reference layer, can represent at least 10 different numeric values, thereby enabling said magnetic random access memory to be used for the direct performance of decimal arithmetic.

* * * * *